United States Patent [19]

Onoe

[11] 3,978,432
[45] Aug. 31, 1976

[54] OSCILLATOR HAVING PLURAL PIEZOELECTRIC VIBRATORS PARALLEL CONNECTED FOR TEMPERATURE COMPENSATION

[76] Inventor: Morio Onoe, 4-9-7, Taishido, Setagaya, Tokyo, Japan

[22] Filed: May 16, 1975

[21] Appl. No.: 578,057

Related U.S. Application Data

[63] Continuation-in-part of Ser. No. 564,945, April 3, 1975, abandoned, which is a continuation of Ser. No. 429,859, Jan. 2, 1974, abandoned.

[30] Foreign Application Priority Data

Dec. 29, 1972 Japan.................................. 47-1217

[52] U.S. Cl................................. 331/162; 331/176
[51] Int. Cl.²......................................... H03B 5/32
[58] Field of Search................ 331/116 R, 162, 176; 310/8.1, 9

[56] References Cited
UNITED STATES PATENTS 1,915,368  6/1933  Lack................................ 331/162 X

FOREIGN PATENTS OR APPLICATIONS 1,117,343  6/1968  United Kingdom............. 331/116 R Primary Examiner—Siegfried H. Grimm
Attorney, Agent, or Firm—William Anthony Drucker

[57] ABSTRACT

A piezoelectric oscillator has two or more piezoelectric vibrator units connected in parallel. At least one said unit has a frequency-temperature characteristic of third degree and the others have characteristic of second degree so as to afford compensation in oscillation frequency in a wide temperature range.

7 Claims, 9 Drawing Figures

OSCILLATOR HAVING PLURAL PIEZOELECTRIC VIBRATORS PARALLEL CONNECTED FOR TEMPERATURE COMPENSATION

This application is a continuation-in-part of application Ser. No. 564,945, filed Apr. 3, 1975 and now abandoned, which is a continuation of application Ser. No. 429,859, filed Jan. 2, 1974, now abandoned.

The present invention relates to oscillator means which have two or more vibrator units incorporated in an oscillator circuit.

An object of the present invention is to provide means for stabilizing oscillation frequency in a piezoelectric oscillator against temperature change.

Another object of the present invention is to provide piezoelectric oscillators which have a high stability over oscillation frequency in a wide temperature range.

Still another object of the present invention is to provide piezoelectric oscillators which have the above-mentioned stability and are compact.

A further object of the present invention is to provide piezoelectric oscillators which have the above-mentioned stability and are easily designed and manufactured.

Other objects and advantages of the present invention will become apparent from the following description taken in connection with the accompanying drawings in which.

Figure 9:
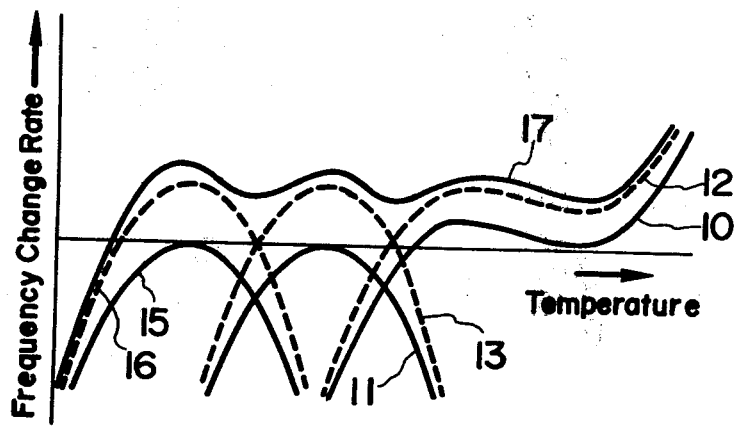

And, FIG. 9 is a diagram illustrating the principle of the computation by means of three vibrator units.

It is well known that oscillators stabilized by piezoelectric vibrators which have a sharp resonance property are used to keep the oscillation frequency constant. In such piezoelectric oscillators, piezoelectric vibrator units having a zero temperature coefficient are used so as to minimize change in oscillation frequency against change in temperature. However, it is only at a specified temperature that such a piezoelectric vibrator unit may be regarded as having a zero temperature coefficient. And, as the vibration frequency changes according to curves such as shown in FIG. 1 or FIG. 2, such a piezoelectric vibrator unit often impedes stability in oscillation frequency when used over a wide temperature range in practical use.

Figure 1:
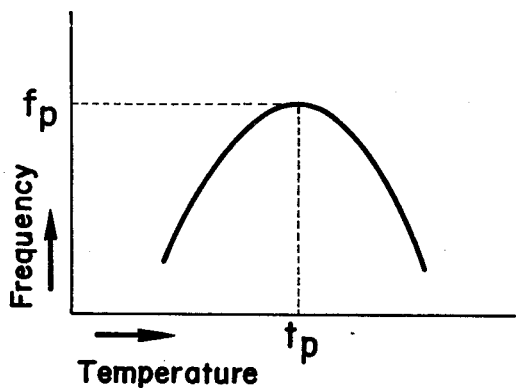
FIG. 1 is a diagram showing a frequency-temperature characteristic curve of second degree in a piezoelectric vibrator unit.
Figure 2:
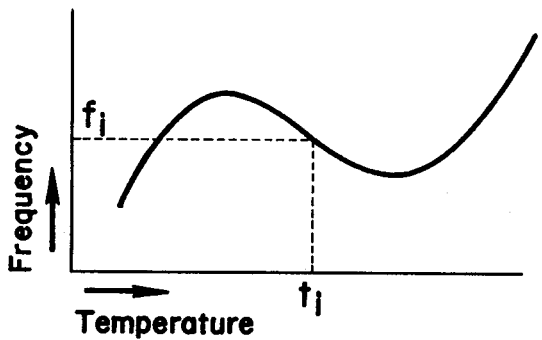
FIG. 2 is a diagram showing a frequency-temperature characteristic curve of third degree in another piezoelectric vibrator unit.

A curve such as shown in FIG. 1 is characterized with respect to a BT-cut, CT-cut, DT-cut, or X-cut quartz plate and is called a second degree characteristic curve. The relation between vibration frequency $f$ and temperature $t$, wherein the values of temperature and frequency, each corresponding to the values at the apex are respectively apex temperature $t_p$ and apex frequency $f_p$, approximates as follows:

$$\frac{f - f_p}{f_p} = a(t - t_p)^2 + \Delta \qquad (1)$$

where $\Delta$ indicates terms of higher orders having very small values.

In a BT-cut quartz vibrator, as $a \approx -4 \times 10^{-8}/°C^2$, it is difficult to keep the value of change in frequency below $5 \times 10^{-6}$ against change in temperature over $\pm 10°C$.

The apex temperature can be shifted arbitrarily by means of changing the cutting angle of the vibrator unit or other appropriate means. By shifting the apex temperature, the value of said coefficient $a$ changes. However, the change in said coefficient is not large in extent.

Figure 3:
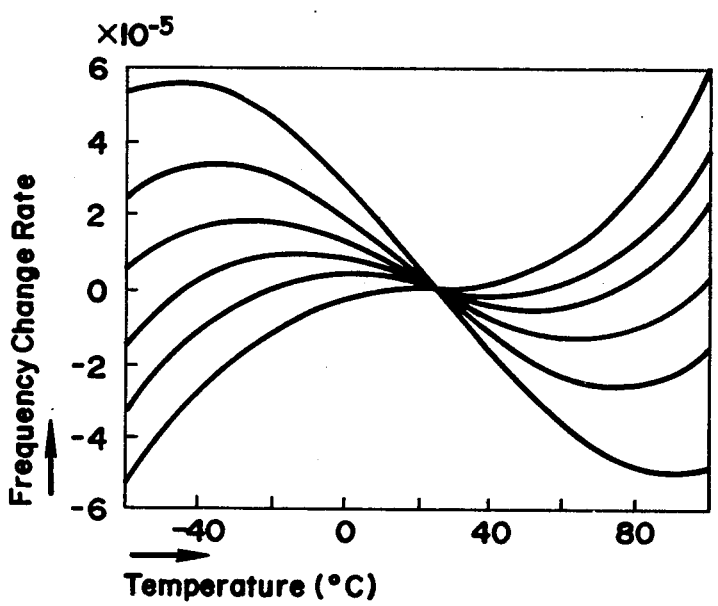
FIG. 3 is a diagram showing a feature of change in frequency temperature characteristic curves in an AT-cut quartz vibrator unit at different cutting angles.

A curve such as shown in FIG. 2 is characterized with respect to a GT-cut quartz plate and is called a third degree characteristic curve. The relation as mentioned above with respect to FIG. 1, wherein the values of temperature and frequency, each corresponding to the values at the inflection point are respectively inflection point temperature $t_i$ and inflection frequency $f_i$, approximate as follows:

$$\frac{f - f_i}{f_i} = \alpha(t - t_i) + \beta(t - t_i)^2 + \alpha(t - t_i)^3 + \Delta \qquad (2)$$

where $\Delta$ indicates terms of higher orders having very small values. And, in an AT-cut quartz vibrator unit, it is difficult to keep the value of change in frequency below $5 \times 10^{-6}$ against change in temperature over a range of $\pm 40°C$. However, as shown in FIG. 3, the characteristic can be changed considerably by changing the cutting angle of the unit, said inflection point temperature being changed little and always restings at about 25°C.

To minimize such a change in oscillation frequency caused by change in temperature, thermostats are preferably used. However, use of thermostats is not desirable in view of bulkiness and increase in electric power consumed thereby. On the other hand, a so-called TCXO (temperature compensation quartz oscillator) which has a variable reactance element such as a varactor connected in parallel with the quartz vibrator so as to control direct current bias voltage of the same by means of a thermosensitive element such as a thermistor is used widely. However, on account of great scattering of the characteristics of said thermosensitive elements, said TCXO has a drawback in that it has difficulty in its design as well as in its adjustment which make it inappropriate for mass production.

Hereupon, it was proposed in Marconi Review, Vol 31, No. 169, page 57 — 1968, to use BT-cut quartz plates connected in parallel to each other in an oscillator circuit as well as in a Japanese document (Denkitsushin Gakkai Zenkokutaikai Koen 112 — 1965) to use AT-cut quartz plates connected in parallel to each other in an oscillator circuit so as to afford compensation in oscillation frequency against temperature change by means of selecting parameters appropriately with respect to said quartz plates. However, in the latter proposal, not only is the method of design not established, but, on account of inconvenience in selecting said inflection point temperature, it is quite difficult to realize compensation at a desired temperature range and particularly at lower temperatures which are very important in practice. In the former proposal, because the frequency-temperature characteristics of BT-cut plates are essentially poor, two vibrator units would not be sufficient. As a result, three or more units are required which practically cause making of the oscillators difficult.

However it has been explained in the foregoing by taking quartz vibrators as examples, that the same applies to other piezoelectric vibrators such as those of piezoelectric ceramic or lithium tantalate. It is well known that the apex temperature of a frequency-temperature characteristic curve of second degree may relatively easily be shifted by selecting composition or cutting angles of said vibrator element and that the flection point temperature of a characteristic curve of third degree is difficult to be shifted.

The present invention is directed to eliminate the drawbacks as stated in the foregoing. In accordance with the present invention, an oscillator having a wide range of compensated temperature can be afforded by means of providing a small number of vibrator units in the oscillation circuit without thermostats or thermistors attached thereto or incorporated therein. An oscillator in accordance with the present invention will reveal a large effect in use for a portable wireless or other transmitters.

Among a plurality of piezoelectric vibrators, at least one is provided with a frequency-temperature characteristic in a curve of third degree and each one of others are provided with a frequency-temperature characteristic in a curve of second degree so as to compensate for change in oscillation frequency in a given temperature range.

Figure 4:
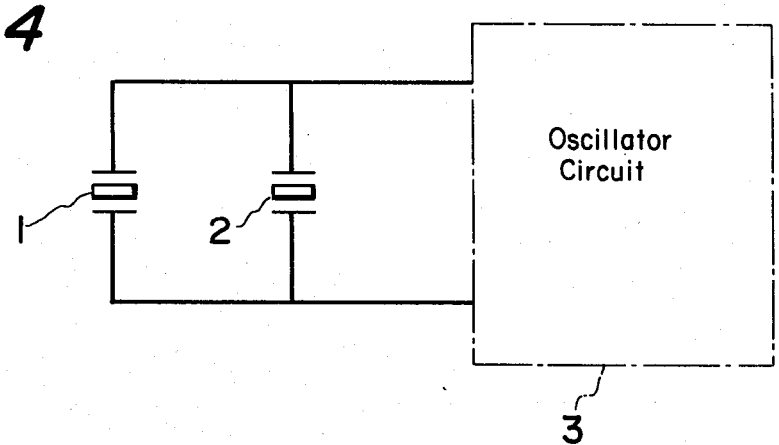
FIG. 4 is a schematic circuit diagram of an embodiment of the present invention.
Figure 5:
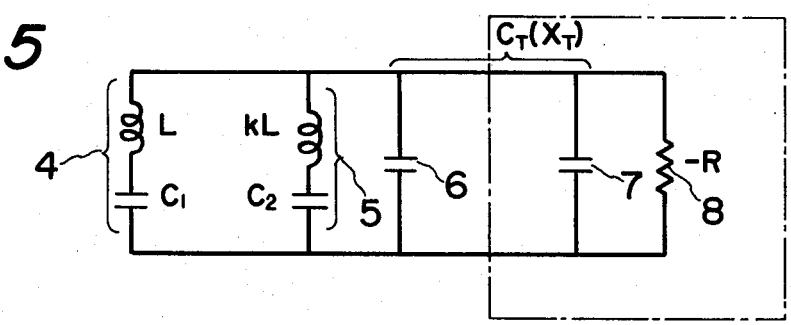
FIG. 5 is an equivalent circuit diagram of an embodiment of the present invention shown in FIG. 4 for the computation of oscillation frequency.

Referring now to FIG. 4, showing an oscillator having two vibrator units for explaining the essential feature of this invention, vibrator unit 1 is provided with a characteristic curve of third degree with a flection point temperature $t_1$, and the vibrator unit 2 is provided with a characteristic curve of second degree with an apex temperature $t_2$. The vibrator units 1 and 2 are connected respectively in parallel to oscillator circuit 3. The oscillation frequency can be computed by means of an equivalent circuit as shown in FIG. 5 in which series resonant circuits 4 and 5 indicate respectively a dynamic impedance arm of vibrator units 1 and 2, parallel capacitance 6 indicates the sum of equivalent parallel capacitances of said two vibrator units, and said oscillation circuit is indicated at a parallel connection of parallel capacitance 7 and a negative resistance 8. It is noted however, that at certain higher frequencies, capacitance 7 may act inductively as having negative values in capacitance.

The equivalent inductance of vibrator unit 1 and the reactance of said vibrator unit are indicated respectively at L and $X_L$. The inductance of vibrator unit 2 is indicated at kL which is k times the value of the inductance L of vibrator unit 1. The sum of values of capacitances 6 and 7 is called load capacitance $C_T$ and the reactance of said load capacitance is indicated at $X_T$.

Figure 6:
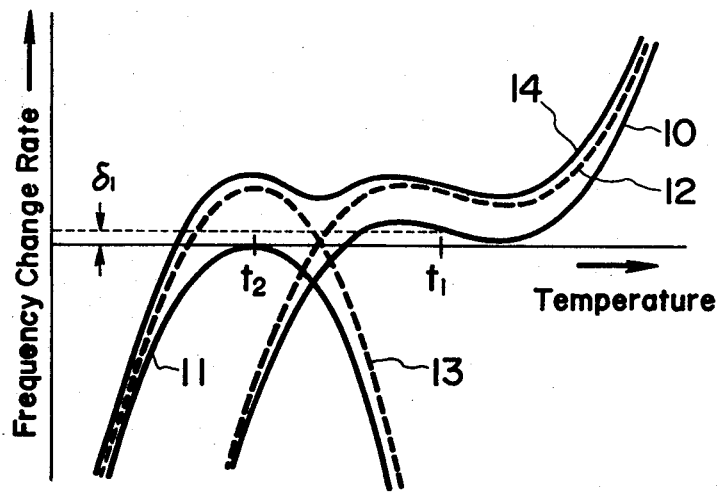
FIG. 6 is a diagram for illustrating the principle of the computation of oscillation frequency.

Referring now to FIG. 6, showing a frequency-temperature characteristic of an oscillator of this invention, curves 10 and 11 are resonance frequency characteristics of dynamic impedance arms 4 and 5 respectively. As will be apparent from the figure, flection point temperature $t_1$ of the vibrator unit 1 shown in FIG. 4, which has a frequency-temperature characteristic curve of third degree, is positioned at a temperature higher than apex temperature $t_2$ of the vibrator unit 2 in FIG. 4 which has a frequency-temperature characteristic curve of second degree. Also, it is noted from FIG. 6, that a portion of curve 10 in a temperature range below the flection point temperature $t_1$ is compensated by a portion of curve 11 in a temperature range below apex temperature $t_2$. Such are principal reasons why a wider compensated temperature range, particularly in a relatively lower temperature range, is obtained in accordance with the present invention. Suppose, at first, that in the equivalent circuit of FIG. 5 dynamic impedance arm 5 is eliminated and only dynamic impedance arm 4 is present. This corresponds to a conventional quartz oscillator having a vibrator unit, and the oscillation frequency $f_{nl}$ thereof will be as in curve 12 in FIG. 6 which curve corresponds to curve 10 translated in an upward direction in the ordinate at a value $X_T/2X_L$.

In a case such as this invention in which two dynamic impedance arms are present as mentioned in the foregoing, as the circuit may be said to have a form in which are connected two series resonance circuits with a connection reactance $X_T$, the oscillation frequency $f_n$ is given by an equation as follows:

$$f_n^2 - (f_{n1} + f_{n2})f_n + f_{n1}f_{n2}\left[1 - \left(\frac{X_T}{2X_L}\right)^2 \frac{1}{k}\right] = 0$$

where k is a ratio of the value of inductance of vibrator unit 1 to the value of inductance of vibrator unit 2.

As this is an equation concerning $f_n$, two radicals will be obtained therefrom. However, such a radical having an effect of compensation in temperature is that as shown at curve 14 in FIG. 6. Because, losses of both vibrator units practically equal each other, the circuit will oscillate with this radical and compensation in temperature will be realized.

Figure 7:
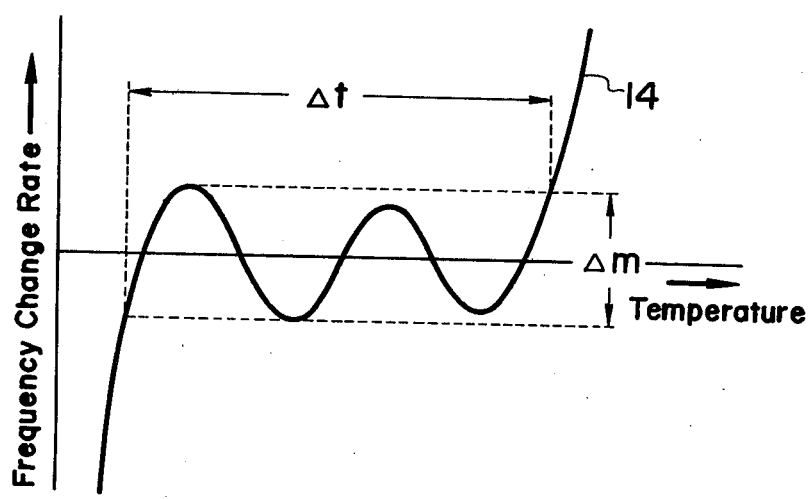
FIG. 7 is a diagram showing a curve which corresponds to curve 14 in FIG. 6 for illustrating compensation frequency change rate $\Delta_m$ and compensation temperature range $\Delta_t$.
Figure 8:
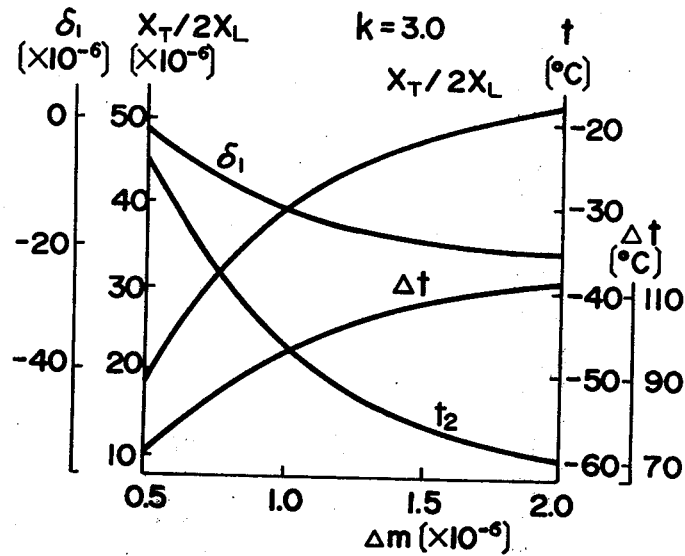
FIG. 8 is a diagram showing combinations of parameters for obtaining a temperature compensation effect in piezoelectric vibrator units in accordance with the present invention.

Referring to FIG. 7, the curve in the diagram corresponds to curve 14 in FIG. 6. The distance between the highest peak and the lowest trough is defined at compensation frequency change rate $\Delta_m$. A range within which is contained the frequency change is defined at compensation temperature range $\Delta_t$. In designing an oscillator, the value of $\Delta_m$ is predetermined. Subsequently, a cutting angle in each vibrator unit, the distance in temperature between flection point temperature $t_1$ and apex temperature $t_2$, the distance between the resonant frequencies of the foregoing dynamic impedance arms at said respective temperatures $t_1$ and $t_2$ which distance, referring to FIG. 6, is a width $\delta_1$ in frequency change rates which corresponds to the flection point temperature at $t_1$ where the apex temperature at $t_2$ is taken for the standard, rate k of the equivalent inductances, and said load capacitance are optimized for parameters so as to obtain the largest value of $\Delta_t$. The computation is easily effected by means of a computer. In FIG. 8 is shown a result of such computation which was selected for a vibrator unit as indicated at 1 in FIG. 4 which was an AT-cut quartz vibrator unit having a cutting angle with which said unit should have a zero-temperature coefficient. The zero-temperature coefficient corresponds to such a case in which coefficients α and β are made zero in equation (2). A BT-cut quartz vibrator unit was used for the vibrator unit as indicated at 2 in FIG. 4, and the value of equivalent inductance rate was selected to three. In the diagram are shown values of parameters $\delta_1$, $t_2$, $(X_T/2X_L)$ to be selected at given values of $\Delta_m$, and also values of $\Delta_t$ which may be computed from the foregoing parameters. Because the values of $\delta_1$ are negative as apparent from the diagram, an apex frequency of the BT-cut vibrator unit must be selected at a value which is lower than a flection point frequency of the AT-cut vibrator unit.

By means of such a computation as mentioned above, it has become apparent that the change in frequency of an oscillator may be contained within $\pm 1 \times 10^{-6}$ for example, in a wide temperature range of 95°. This has also been confirmed experimentally.

In the foregoing has been shown an example with respect to a combination of AT-cut and BT-cut plates. However, the consequence does apply also to another oscillator in which one or each vibrator unit is made of double rotation Y-cut plate having a zero-temperature coefficient. Also, in cases where the frequency is relatively low, GT-cut plates may be used for the aforementioned vibrator units having a third degree characteristic, and for the aforementioned vibrator units having a second degree characteristic, various vibrator units such as CT-cut, DT-cut, ET-cut, FT-cut, longitudinal vibration X-cut, flexual vibration X-cut, MT-cut and NT-cut plates as well as XY-cut flexual rods may be used. The material for the vibrator units is not limited to quartz, but may also be single crystals of lithium tantalate or piezoelectric ceramics.

Though the foregoing equations (1) and (2) are approximate and terms of higher orders are required so as to express actual characteristics in a wider temperature range, it is apparent that the foregoing steps for the design of an oscillator apply as is. If a wider compensation temperature range is desired, another vibrator unit having a second degree temperature characteristic is further connected in parallel thereto. For example, a characteristic of three vibrator units in parallel connection is shown in FIG. 9. Referring to FIG. 9, each curve 10, 11 or 15 shows a resonance frequency respectively of each dynamic impedance arm of the corresponding vibrator unit, each curve 12, 13 or 16 shows an oscillation frequency respectively of an oscillator in which each said dynamic impedance arm is present independently, and curve 17 is an oscillation frequency in which all said vibrator units are present. It will be apparent from FIG. 9, that a compensation temperature range which is wider than in FIG. 6 can be afforded. As it may be understood from above, increase in number of vibrator units results in widening the compensation temperature range, however it is followed by increase in the difficulty of design and manufacture of an oscillator.

The value of resonant frequency or the equivalent inductance of an actual vibrator unit processed by means of mechanical working or vacuum evaporation techniques may have errors in the values designed on a paper design. So, a small reactance may be connected in series with said vibrator unit so as to adjust the values thereof.

Having thus described my invention, what I claim for Letters Patent is:

1. A piezoelectric oscillator which comprises a plurality of vibrator circuits each having therein a piezoelectric vibrator unit, said vibrator unit in each of said vibrator circuits having a reactance loss substantially equal to that of said vibrator unit in another said vibrator circuit, each said vibrator circuit being connected in parallel to one another and connected in parallel to a oscillator circuit so as to stabilize the oscillation frequency, said vibrator unit in one of said vibrator circuits having a frequency-temperature characteristic curve of third degree and said vibrator unit in each of all other said vibrator circuits having a frequency-temperature characteristic curve of second degree, said vibrator unit having a frequency-temperature characteristic curve of third degree having a flection point temperature relatively higher than an apex temperature of each said vibrator unit having a frequency-temperature characteristic curve of second degree, and said vibrator unit having a frequency-temperature characteristic curve of third degree and at least one of said vibrator units having a frequency-temperature characteristic curve of second degree being selected so that a portion of said frequency-temperature characteristic curve of third degree in a temperature range lower than said flection point temperature is compensated by means of a portion of said frequency-temperature characteristic curve of second degree in a temperature range lower than said apex temperature.

2. A piezoelectric oscillator as claimed in claim 1, wherein said plurality of vibrator circuits consists of two said vibrator units.

3. A piezoelectric oscillator as claimed in claim 2, wherein said piezoelectric vibrator unit having a frequency-temperature characteristic curve of third degree being an AT-cut quartz plate and said piezoelectric vibrator unit having a frequency-temperature characteristic curve of second degree being a BT-cut quartz plate.

4. A piezoelectric oscillator as claimed in claim 2, wherein at least one of said piezoelectric vibrator unit being a double rotation Y-cut quartz plate.

5. A piezoelectric oscillator as claimed in claim 1, wherein said piezoelectric vibrator unit having a frequency-temperature characteristic curve of third degree is a GT-cut plate and said piezoelectric vibrator unit having a frequency-temperature characteristic curve of second degree is one selected from a group of CT-cut, DT-cut, ET-cut, FT-cut, longitudinal vibration X-cut, flection vibration X-cut, MT-cut, and NT-cut plates and XY-cut flection bars.

6. A piezoelectric oscillator as claimed in claim 1, wherein said piezoelectric vibrator units in said plurality of vibrator circuits are made of materials selected from a group of quartz, single crystals of lithium tantalate, and piezoelectric ceramics.

7. A piezoelectric oscillator as claimed in claim 1, wherein at least one of said vibration circuits has, for the adjustment of the value of the equivalent inductance of said vibrator unit in said vibration circuit, an adjustable reactance connected in series to said vibrator unit.

* * * * *